United States Patent
Su et al.

(10) Patent No.: US 9,775,249 B2
(45) Date of Patent: Sep. 26, 2017

(54) FLEXIBLE CIRCUIT BOARD COMBINED WITH CARRIER BOARD AND MANUFACTURING METHOD THEREOF

(71) Applicant: ADVANCED FLEXIBLE CIRCUITS CO., LTD., Taoyuan County (TW)

(72) Inventors: Kuo-Fu Su, Taoyuan County (TW); Gwun-Jin Lin, Taoyuan County (TW)

(73) Assignee: Advanced Flexible Circuits Co., Ltd., Taoyuan (TW)

( * ) Notice: Subject to any disclaimer, the term of this patent is extended or adjusted under 35 U.S.C. 154(b) by 0 days.

(21) Appl. No.: 15/240,155

(22) Filed: Aug. 18, 2016

(65) Prior Publication Data

US 2016/0360611 A1 Dec. 8, 2016

Related U.S. Application Data

(62) Division of application No. 14/714,492, filed on May 18, 2015, now abandoned.

(30) Foreign Application Priority Data

Jun. 9, 2014 (TW) .............................. 103119828 A

(51) Int. Cl.
| | | |
|---|---|---|
| *H05K 3/00* | (2006.01) |
| *H05K 1/02* | (2006.01) |
| *H05K 1/11* | (2006.01) |
| *H05K 3/06* | (2006.01) |
| *H05K 3/18* | (2006.01) |
| *H05K 3/42* | (2006.01) |
| *H05K 3/02* | (2006.01) |
| *H05K 1/09* | (2006.01) |

(52) U.S. Cl.
CPC ........... *H05K 3/007* (2013.01); *H05K 1/0281* (2013.01); *H05K 1/0298* (2013.01); *H05K 1/09* (2013.01); *H05K 1/115* (2013.01); *H05K 3/025* (2013.01); *H05K 3/064* (2013.01); *H05K 3/188* (2013.01); *H05K 3/429* (2013.01); *H05K 2201/0338* (2013.01); *H05K 2201/0352* (2013.01); *H05K 2201/09563* (2013.01); *H05K 2203/0152* (2013.01)

(58) Field of Classification Search
None
See application file for complete search history.

(56) References Cited

U.S. PATENT DOCUMENTS

| 6,548,153 B2 * | 4/2003 | Kataoka | H05K 3/025 428/209 |
| 2006/0219428 A1 * | 10/2006 | Chinda | H05K 3/421 174/257 |

* cited by examiner

Primary Examiner — Jiong-Ping Lu
(74) Attorney, Agent, or Firm — Rosenberg, Klein & Lee

(57) ABSTRACT

Disclosed is a structure of a flexible circuit board combined with a carrier board. The carrier board includes a thick copper layer, a thin copper layer, and a release layer formed between the thick copper layer and the thin copper layer. The flexible circuit substrate and the carrier board are bonded together by an adhesive layer. In a subsequent process, the release layer, together with the thick copper layer, is peeled from a top surface of the thin copper layer and the thin copper layer is preserved by being bonded by the adhesive layer to the flexible circuit substrate.

10 Claims, 10 Drawing Sheets

FLEXIBLE CIRCUIT BOARD COMBINED WITH CARRIER BOARD AND MANUFACTURING METHOD THEREOF

REFERENCE TO RELATED APPLICATION

This Application is being filed as a Divisional Application of Ser. No. 14/714,492, filed 18 May 2015, currently pending.

BACKGROUND OF THE INVENTION

1. Field of the Invention

The present invention relates to a structure of a flexible circuit board and a manufacturing method thereof, and in particular to a flexible circuit board combined with a carrier board and a manufacturing method thereof.

2. The Related Arts

Flexible circuit boards have been widely used in all sorts of electronic products, especially those electronic products that are light and compact. For example, consumer electronic products, including mobile phones, digital cameras, computer peripherals, flat displays, and game machines, all involve the use of flexible circuit boards.

With the amount of signal transmission being increasingly enlarged in all sorts of electronic products, the number of signal transmission lines used is increased. On the other hand, with the desire for light and compact electronic products, the line width of conductive paths involved in a flexible circuit board is increasingly reduced, and so is the thickness thereof.

Although the application of the flexible circuit board is extremely wide, due to the nature of having a reduced thickness and being flexible, there are common troubles with the flexible circuit boards in respect of shipping, subsequent processing, transportation among various manufacturing processes, and assembling with electronic components and skills and expertise are required. For example, due to the nature of being light and thin and flexible, a flexible circuit board must be maintained flatness during shipping, processing, and conveyance, otherwise bending and separation of conductive traces or copper foils from the flexible circuit may occur and thus affecting the quality thereof.

SUMMARY OF THE INVENTION

Thus, to cope with the difficulties of shipping, processing, and transporting a flexible circuit board resulting from the nature of the flexible circuit board that is light and thin and flexible, an object of the present invention is to provide a structure of a flexible circuit board combined with a carrier board.

The technical solution that the present invention adopts to achieve the above object is that a carrier board is combined to at least a surface of a flexible circuit substrate. The carrier board comprises a thick copper layer; a thin copper layer; and a release layer formed between the thick copper layer and a top surface of the thin copper layer. The flexible circuit substrate is bonded to the carrier board by an adhesive layer. At least one through hole is formed through the carrier board and the flexible circuit substrate. In an example of the present invention, the flexible circuit substrate has a surface facing the carrier board and comprising a bottom copper layer formed thereon. An electroplating layer is formed on a top surface of the thick copper layer, a hole wall surface of the through hole, and a bottom surface of the bottom copper layer.

In an embodiment of the present invention, the flexible circuit substrate has opposite surfaces each comprising a carrier board combined therewith. At least one through hole is formed through the two carrier boards and the flexible circuit substrate. An electroplating layer is formed on surfaces of thick copper layers of the two carrier boards and the hole wall surface of the through hole.

The through hole of the previous embodiments can be replaced by a blind hole.

The flexible circuit substrate can be a single-sided board, a double-sided board, a multiple-layered board, or a rigid-flex board.

The efficacy is that the flexible circuit substrate comprises at least one carrier board combined therewith so that during shipping, processing, and transportation of the flexible circuit board, the carrier board provides stability for the flexible circuit board so as to maintain high level stability for the flexible circuit board in various processes including shipping and various manufacturing processes. In the structure provided by the present invention, through peeling a release layer in combination with the thick copper layer from the thin copper layer, the thin copper layer can be preserved as being bonded by an adhesive layer to the flexible circuit substrate for being used in the subsequent manufacturing processes.

BRIEF DESCRIPTION OF THE DRAWINGS

The present invention will be apparent to those skilled in the art by reading the following description of preferred embodiments of the present invention, with reference to the attached drawings, in which.

DETAILED DESCRIPTION OF THE PREFERRED EMBODIMENTS

Figure 1A:
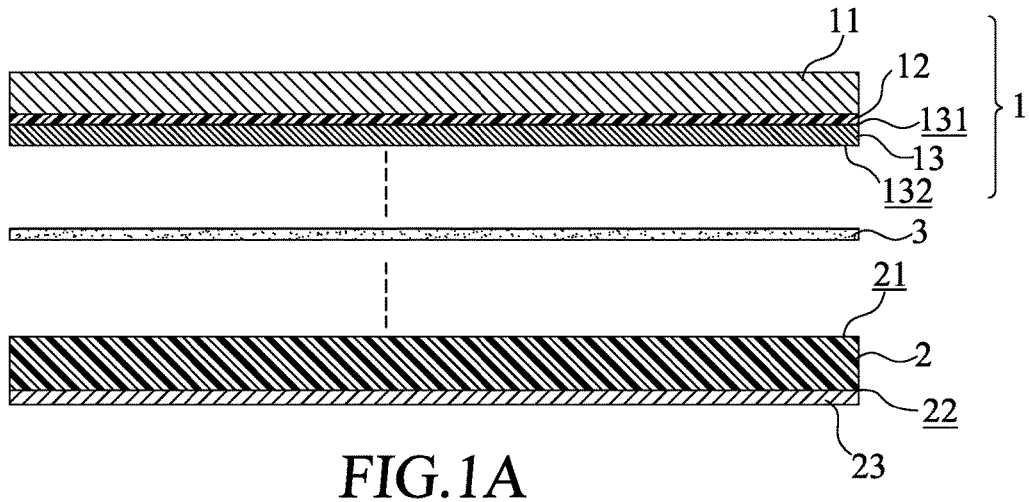
FIGS. 1A-1L illustrate a manufacturing process of a first embodiment of the present invention.

Referring to FIGS. 1A-1L, a manufacturing process of a first embodiment of the present invention is illustrated. As shown in FIG. 1A, a first carrier board 1 comprises a first thick copper layer 11, a first release layer 12, and a first thin copper layer 13, wherein the first thick copper layer 11 has a thickness that is greater than that of the first thin copper layer 13. For example, the thickness of the first thick copper layer 11 can be between 12-35 micrometers (μm) and the thickness of the first thin copper layer 13 can be between 1-5 micrometers (μm). The first thin copper layer 13 has a top surface 131 and a bottom surface 132. The first release layer 12 is formed between the first thick copper layer 11 and the top surface 131 of the first thin copper layer 13.

A flexible circuit substrate 2 has a first surface 21 and a second surface 22. The second surface 22 of the flexible circuit substrate 2 comprises a bottom copper layer 23 formed thereon.

Figure 1B:
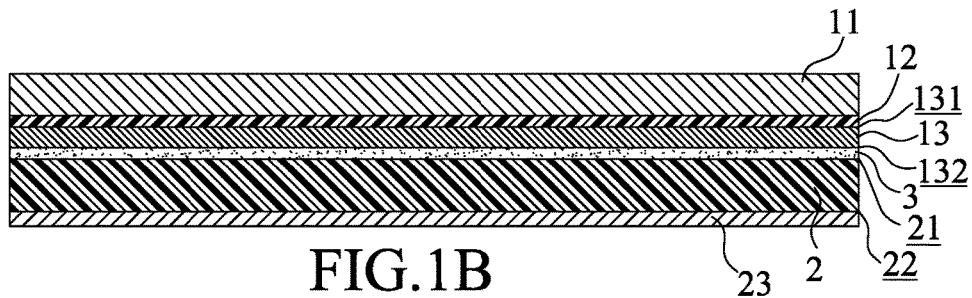

In the manufacture of the present invention, the first surface 21 of the flexible circuit substrate 2 is bonded, through pressing, to the bottom surface 132 of the first thin copper layer 13 of the first carrier board 1 by means of a first adhesive layer 3 (as shown in FIG. 1B).

Figure 1C:
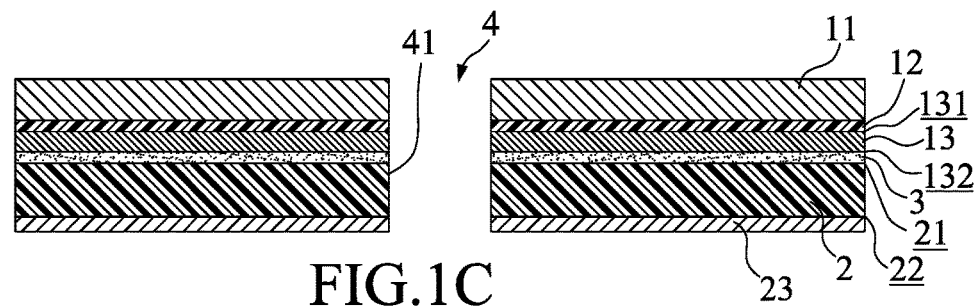

After the first carrier board 1 and the flexible circuit substrate 2 are bonded to each other, at least one through hole 4 is formed through the first thick copper layer 11, the first release layer 12, and the first thin copper layer 13 of the first carrier board 1, the adhesive layer 3, the flexible circuit substrate 2, and the bottom copper layer 23 (as shown in FIG. 1C). The through hole 4 has a hole wall surface 41.

A first electroplating layer 51 is formed on a top surface of the first thick copper layer 11, the hole wall surface 41, and a bottom surface of the bottom copper layer 23.

Figure 1D:
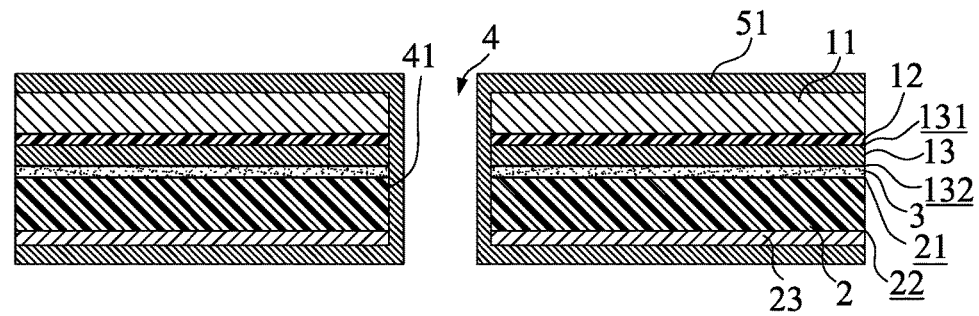

The first electroplating layer 51 is formed on the top surface of the first thick copper layer 11, the hole wall surface 41, and the bottom surface of the bottom copper layer 23 after the through hole 4 has been formed (as shown in FIG. 1D).

Figure 1E:
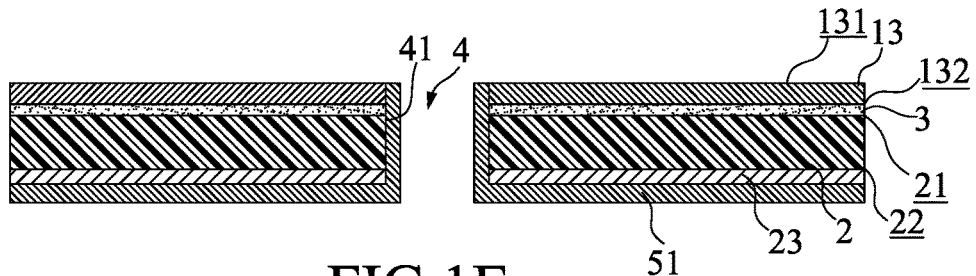

In the subsequent process, the first release layer 12 is peeled, together with the first thick copper layer 11, from the top surface 131 of the first thin copper layer 13, with the first thin copper layer 13 being preserved by being bonded by the first adhesive layer 3 to the first surface 21 of the flexible circuit substrate 2 (as shown in FIG. 1E).

Figure 1F:
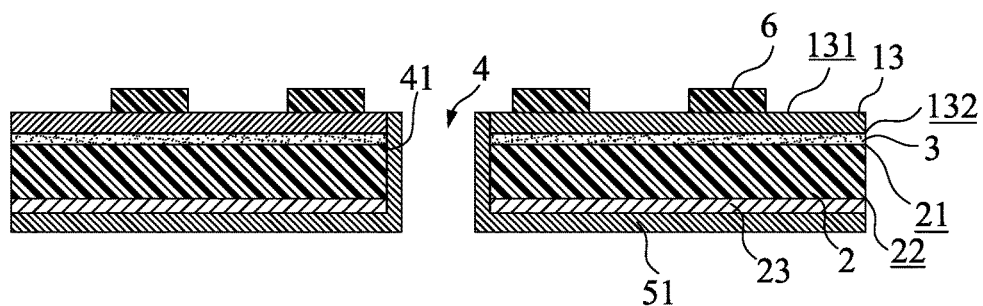
Figure 1G:
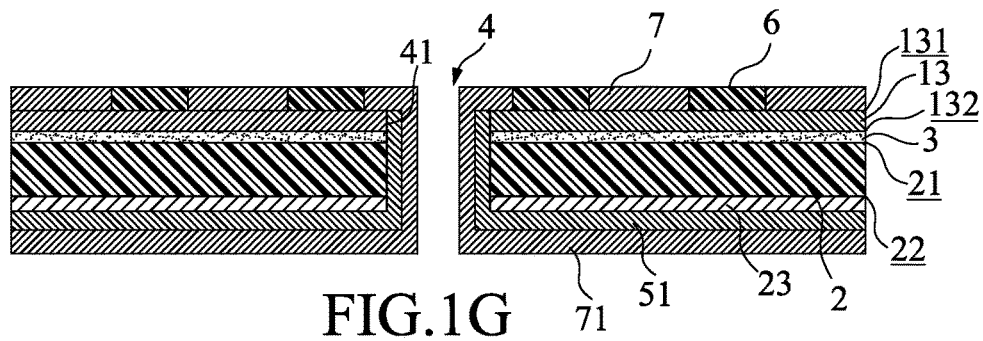

Afterwards, at least one photoresist layer 6 is formed at a predetermined location on the top surface 131 of the first thin copper layer 13 (as shown in FIG. 1F) and an upper conductor layer 7 is formed on areas of the top surface 131 of the first thin copper layer 13 that are not covered by the photoresist layer 6 and a lower conductor layer 71 is formed on the bottom surface of the first electroplating layer 51 (as shown in FIG. 1G).

Figure 1H:
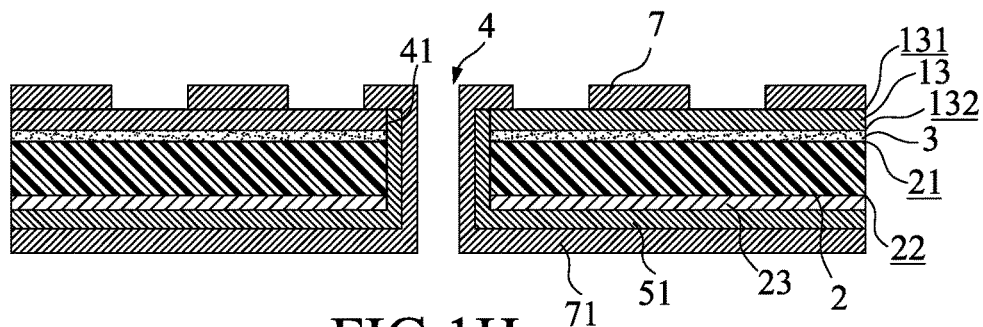
Figure 1I:
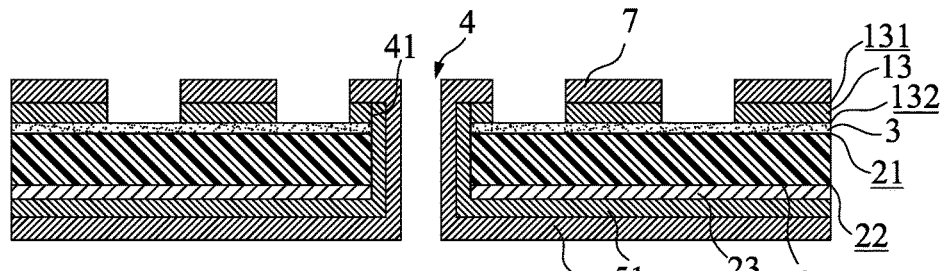

The photoresist layer 6 is then removed so that the upper conductor layer 7 is left and formed on the top surface 131 of the first thin copper layer 13 (as shown in FIG. 1H). Micro-etching is then applied on areas of the first thin copper layer 13 that are covered by the upper conductor layer 7 (as shown in FIG. 1I) so as to have the upper conductor layer 7 forming a plurality of conductive lines.

Figure 1J:
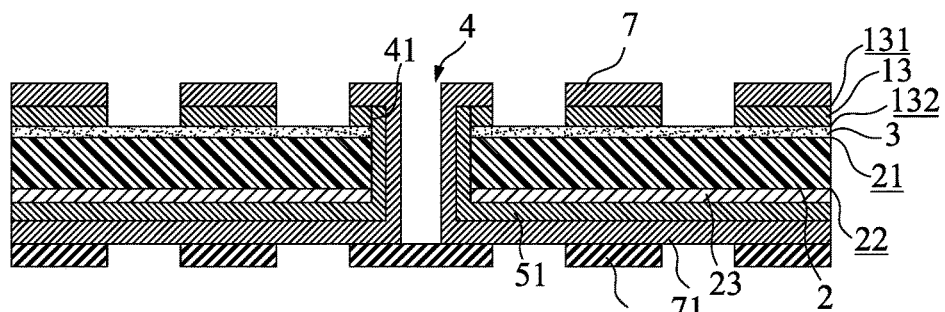
Figure 1K:
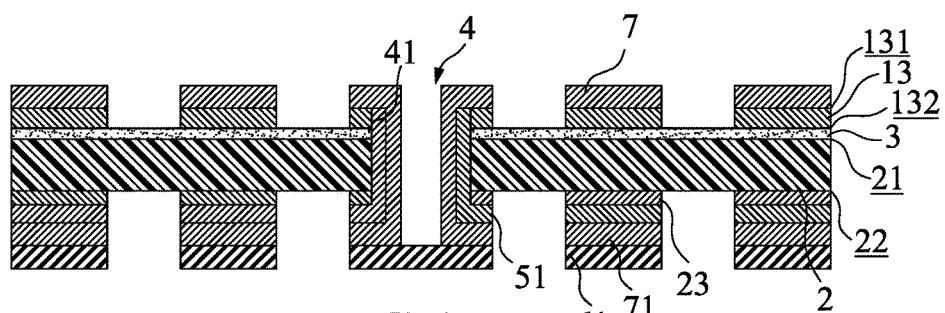
Figure 1L:
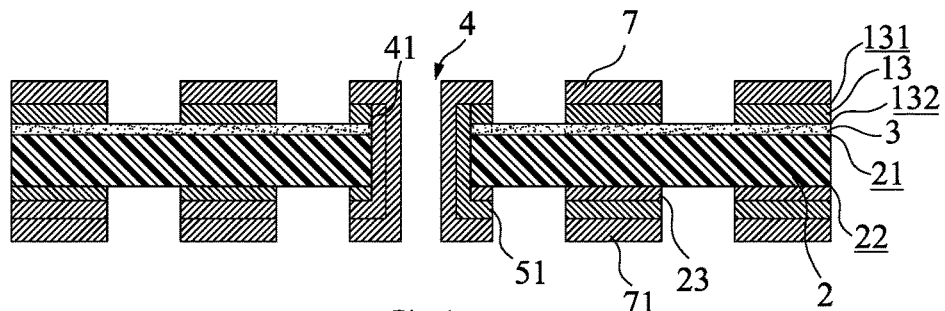

Next, at least one lower photoresist layer 61 is formed on a predetermined location on the bottom surface of the lower conductor layer 71 (as shown in FIG. 1J) and etching is applied to areas of the lower conductor layer 71, the first electroplating layer 51, and the bottom copper layer 23 that are not covered by the lower photoresist layer 61 (as shown in FIG. 1K) so as to have the lower conductor layer 71 forming a plurality of conductive lines. Finally, the lower photoresist layer 61 is removed (as shown in FIG. 1L).

Figure 2A:
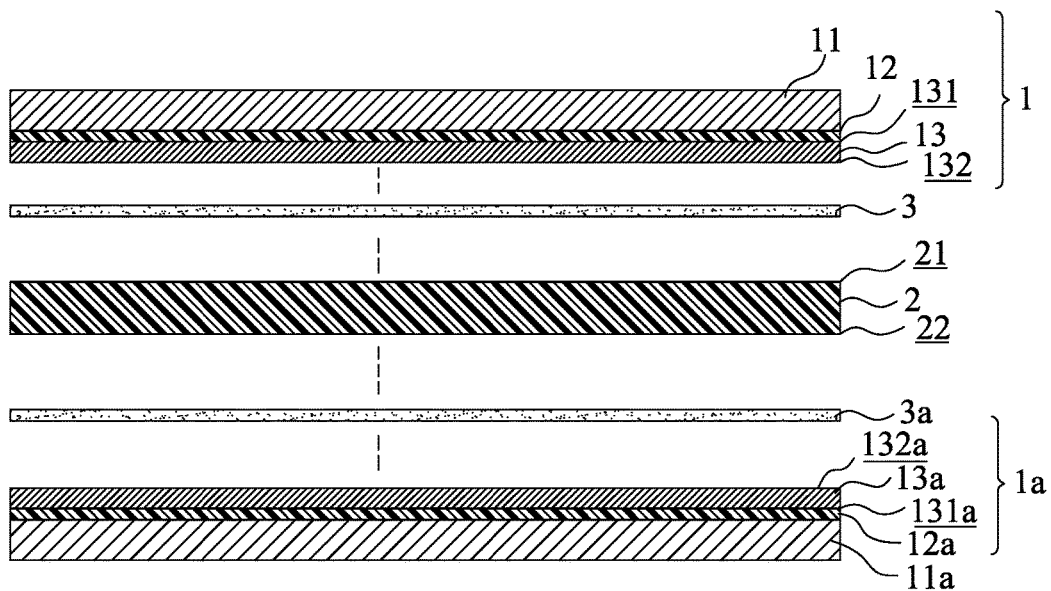
FIGS. 2A-2I illustrate a manufacturing process of a second embodiment of the present invention.

Referring to FIGS. 2A-2I, a manufacturing process of a second embodiment of the present invention is illustrated. As shown in FIG. 2A, a first carrier board 1 is provided, having a structure identical to that of the first carrier board 1 shown in FIG. 1A and comprising a first thick copper layer 11, a first release layer 12, and a first thin copper layer 13.

A second carrier board 1a is also provided, similarly comprising a second thick copper layer 11a, a second release layer 12a, and a second thin copper layer 13a.

Figure 2B:
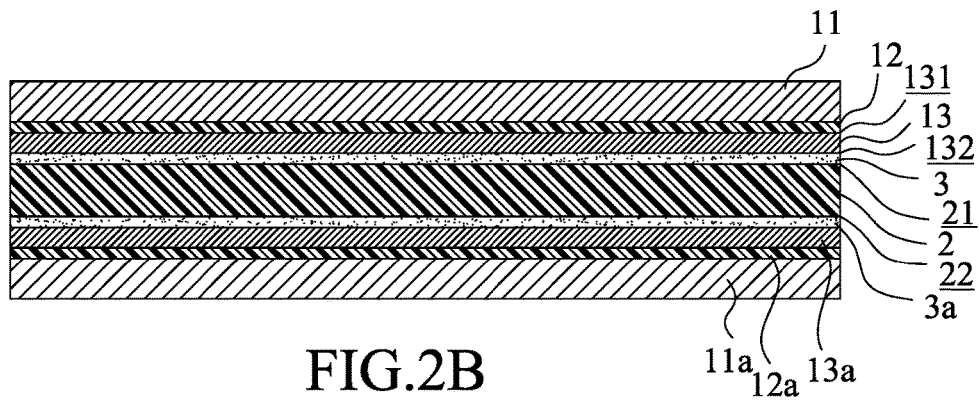

After the formation of the first carrier board 1 and the second carrier board 1a, a first surface 21 of a flexible circuit substrate 2 is bonded, through pressing, to a bottom surface 132 of the first thin copper layer 13 of the first carrier board 1 by means of a first adhesive layer 3; and a second surface 22 of the flexible circuit substrate 2 is bonded, through pressing, to a top surface 132a of the second thin copper layer 13a of the second carrier board 1a by means of a second adhesive layer 3a (as shown in FIG. 2B).

Figure 2C:
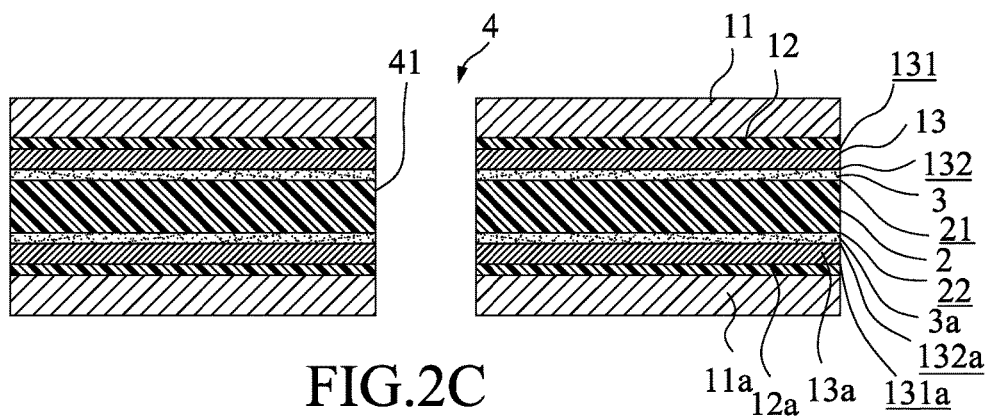

Then, at least one through hole 4 is formed through the first thick copper layer 11, the first release layer 12, the first thin copper layer 13, the first adhesive layer 3, the flexible circuit substrate 2, the second adhesive layer 3a, the second thin copper layer 13a, the second release layer 12a, and the second thick copper layer 11a. The through hole 4 has a hole wall surface 41 (as shown in FIG. 2C).

Figure 2D:
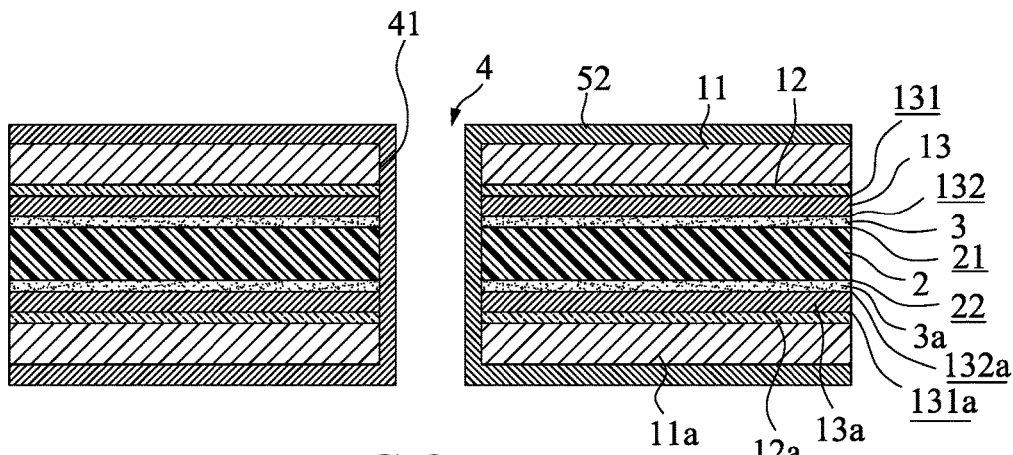

A second electroplating layer 52 is formed on a top surface of the first thick copper layer 11, the hole wall surface 41, a bottom surface of the second thick copper layer 11a (as shown in FIG. 2D).

Figure 2E:
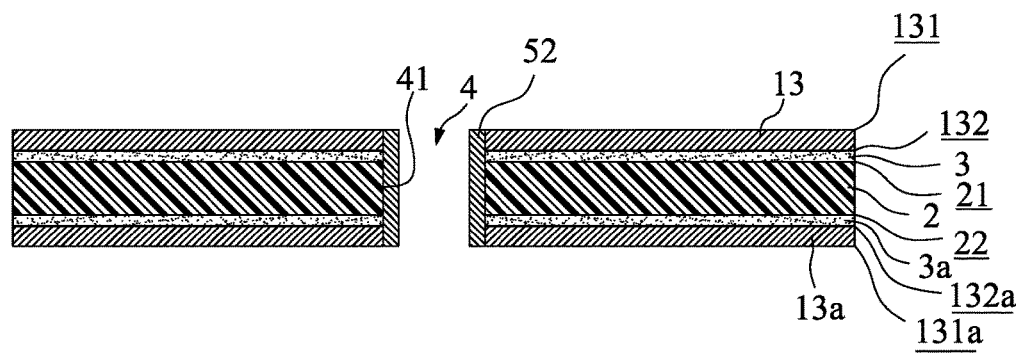

In the subsequent process, the first release layer 12 is peeled, together with the first thick copper layer 11, from the top surface 131 of the first thin copper layer 13, with the first thin copper layer 13 being preserved by being bonded by the first adhesive layer 3 to the first surface 21 of the flexible circuit substrate 2; and the second release layer 12a is peeled, together with the second thick copper layer 11a, from a bottom surface 131a of the second thin copper layer 13a, with the second thin copper layer 13a being preserved by being bonded by the second adhesive layer 3a to the second surface 22 of the flexible circuit substrate 2 (as shown in FIG. 2E).

Figure 2F:
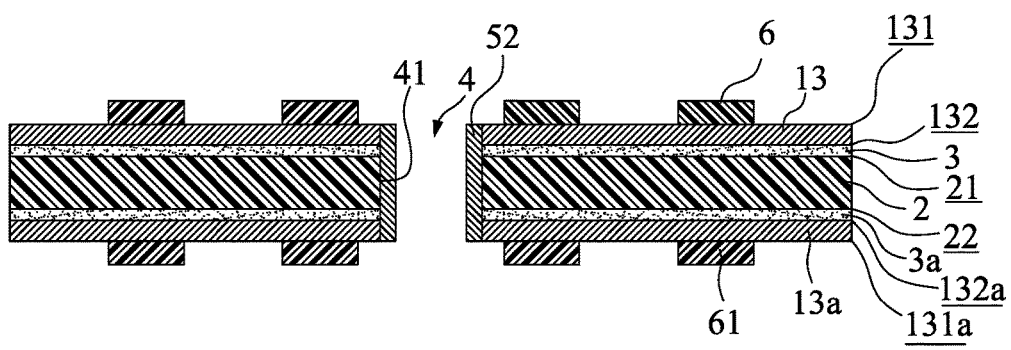

Afterwards, at least one photoresist layer 6 is formed at a predetermined location on the top surface 131 of the first thin copper layer 13 and at least one lower photoresist layer 61 is formed on a predetermined location on the bottom surface 131a of the second thin copper layer 13a (as shown in FIG. 2F).

Figure 2G:
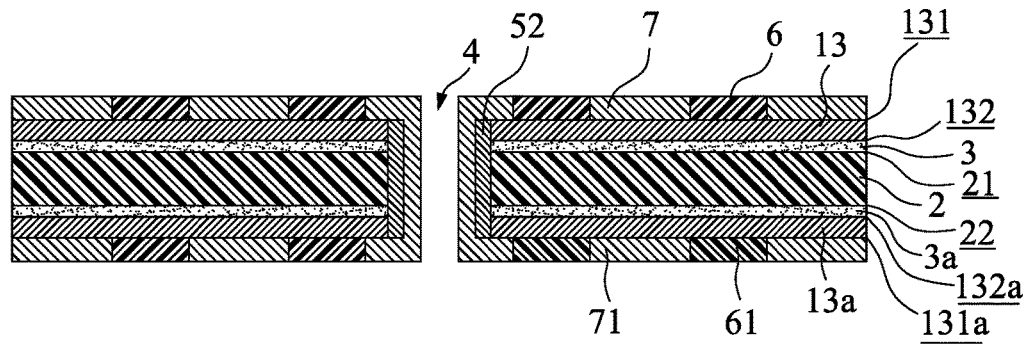
Figure 2H:
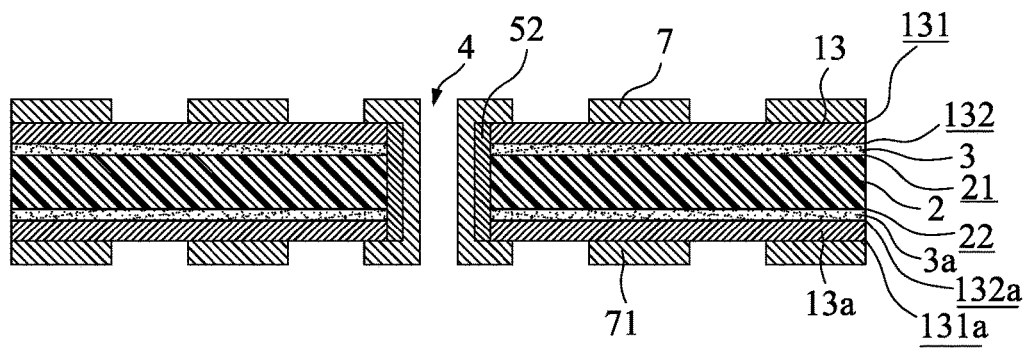

Then, an upper conductor layer 7 is formed on areas of the top surface 131 of the first thin copper layer 13 that are not covered by the photoresist layer 6 and a lower conductor layer 71 is formed on areas of the bottom surface 131a of the second thin copper layer 13a that are not covered by the lower photoresist layer 61 (as shown in FIG. 2G). And, then, the photoresist layer 6 and the lower photoresist layer 61 are removed (as shown in FIG. 2H).

Figure 2I:
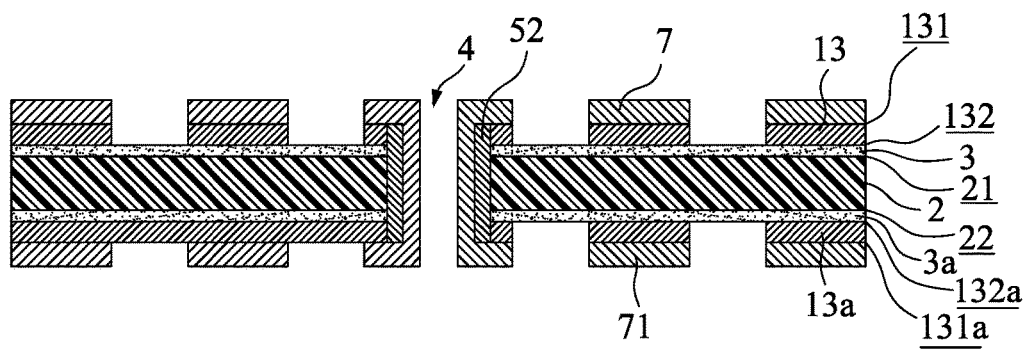

Micro-etching is applied on areas of the first thin copper layer 13 that are covered by the upper conductor layer 7 and areas of the second thin copper layer 13a that are not covered by the lower conductor layer 71 (as shown in FIG. 2I), so as to respectively form upper conductive line and lower conductive lines.

Figure 3A:
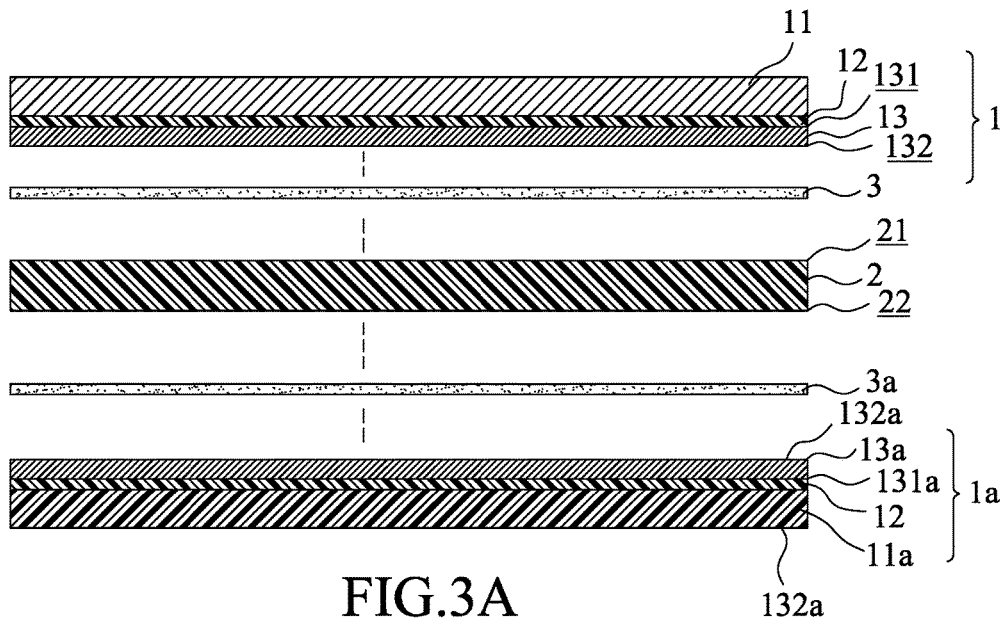
FIGS. 3A-3I illustrate a manufacturing process of a third embodiment of the present invention.

Referring to FIGS. 3A-3I, a manufacturing process of a third embodiment of the present invention is illustrated. As shown in FIG. 3A, a first carrier board 1 is provided, having a structure identical to that of the first carrier board 1 shown in FIG. 1A and comprising a first thick copper layer 11, a first release layer 12, and a first thin copper layer 13. A second carrier board 1a is also provided, similarly comprising a second thick copper layer 11a, a second release layer 12a, and a second thin copper layer 13a.

Figure 3B:
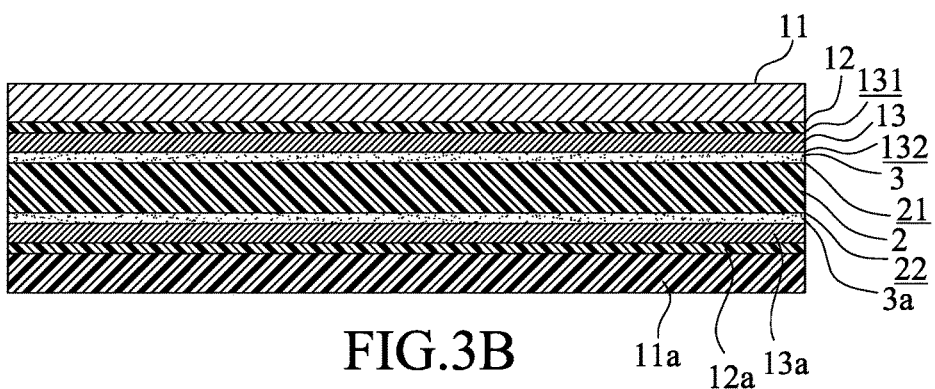

After the formation of the first carrier board 1 and the second carrier board 1a, a first surface 21 of a flexible circuit substrate 2 is bonded, through pressing, to a bottom surface 132 of the first thin copper layer 13 of the first carrier board 1 by means of a first adhesive layer 3; and a second surface 22 of the flexible circuit substrate 2 is bonded, through pressing, to a top surface 132a of the second thin copper layer 13a of the second carrier board 1a by means of a second adhesive layer 3a (as shown in FIG. 3B).

Figure 3C:
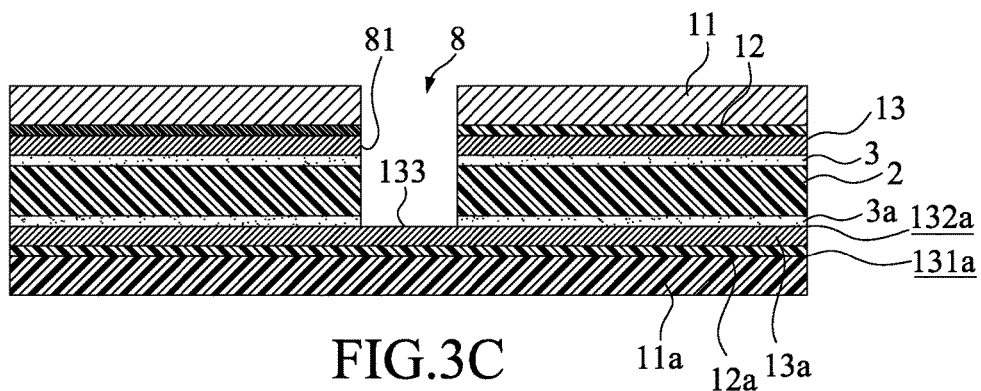

Then, at least one blind hole 8 is formed and extends through the first thick copper layer 11, the first release layer 12, the first thin copper layer 13, the first adhesive layer 3, the flexible circuit substrate 2, and the second adhesive layer 3a. As such, a portion of the top surface 132a of the second thin copper layer 13a to which the via 8 corresponds is exposed to form a thin copper contact zone 133. The blind hole 8 has a blind hole wall surface 81 (as shown in FIG. 3C).

Figure 3D:
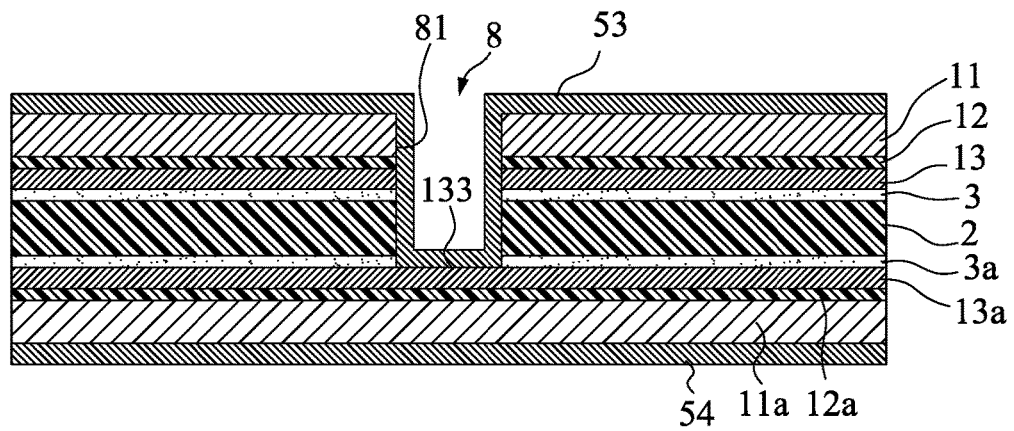

Afterwards, a third electroplating layer 53 is formed on a top surface of the first thick copper layer 11, the blind hole wall surface 81, the thin copper contact zone 133, and a bottom surface of the second thick copper layer 11a (as shown in FIG. 3D).

Figure 3E:
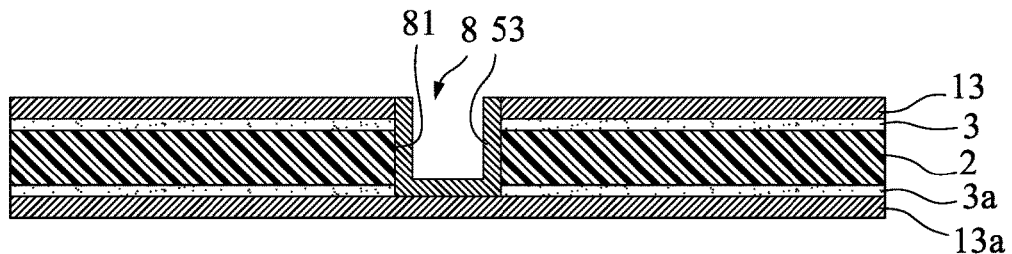

In the subsequent process, the first release layer 12 is peeled, together with the first thick copper layer 11, from the top surface 131 of the first thin copper layer 13, with the first thin copper layer 13 being preserved by being bonded by the first adhesive layer 3 to the first surface 21 of the flexible circuit substrate 2; and the second release layer 12a is peeled, together with the second thick copper layer 11a, from a bottom surface 131a of the second thin copper layer 13a, with the second thin copper layer 13a being preserved by being bonded by the second adhesive layer 3a to the second surface 22 of the flexible circuit substrate 2 (as shown in FIG. 3E).

Figure 3F:
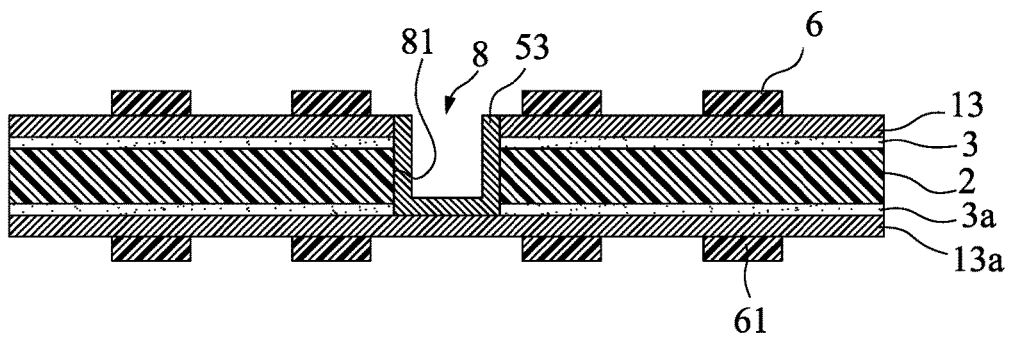

Afterwards, at least one photoresist layer 6 is formed at a predetermined location on the top surface 131 of the first thin copper layer 13 and at least one lower photoresist layer 61 is formed on a predetermined location on the bottom surface 131a of the second thin copper layer 13a (as shown in FIG. 3F).

Figure 3G:
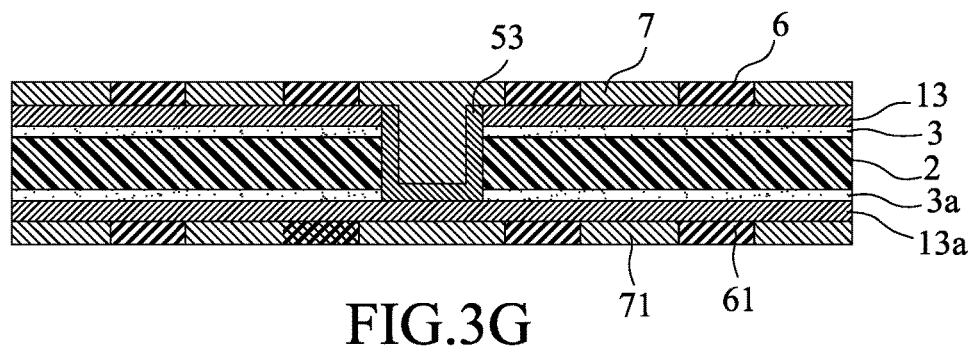
Figure 3H:
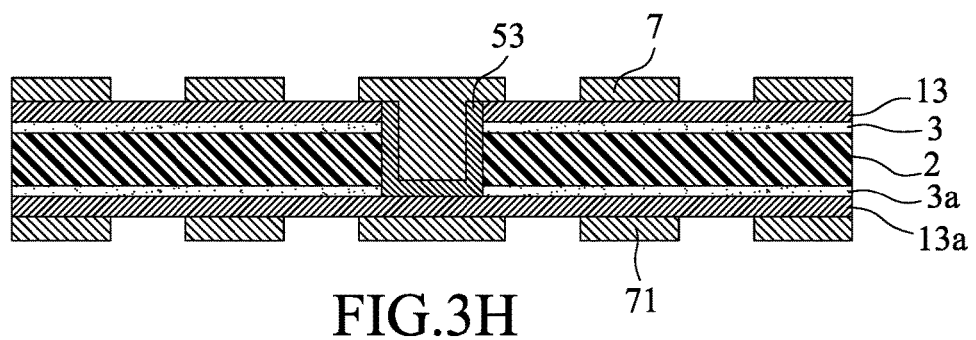

Then, an upper conductor layer 7 is formed on areas of the top surface 131 of the first thin copper layer 13 that are not covered by the photoresist layer 6 and a lower conductor layer 71 is formed on areas of the bottom surface 131a of the second thin copper layer 13a that are not covered by the lower photoresist layer 61 (as shown in FIG. 3G). And, then, the photoresist layer 6 and the lower photoresist layer 61 are removed (as shown in FIG. 3H).

Figure 3I:
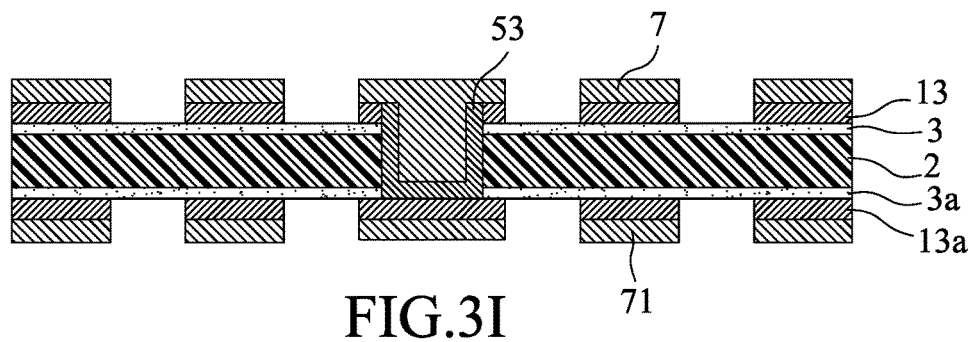

Micro-etching is applied on areas of the first thin copper layer 13 that are covered by the upper conductor layer 7 and areas of the second thin copper layer 13a that are not covered by the lower conductor layer 71 (as shown in FIG. 3I), so as to respectively form upper conductive line and lower conductive lines.

In the previously described embodiments, the flexible circuit substrate 2 can be a single-sided board, a double-sided board, a multiple-layered board, or a rigid-flex board. The multiple-layered board can be formed of multiple single-sided boards, or multiple double-sided boards, or multiple single-sided boards and multiple double-sided boards. The rigid-flex board can be formed of a flexible circuit substrate and a rigid circuit board.

Figure 4:
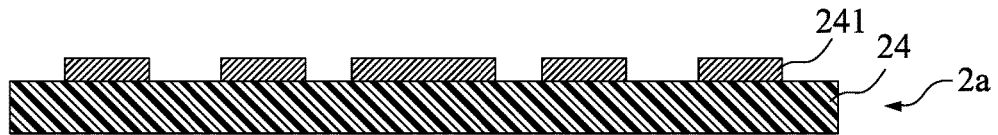
FIG. 4 is a schematic cross-sectional view showing a flexible circuit substrate according to the present invention comprising a single-sided board.

For example, FIG. 4 is a schematic cross-sectional view showing a flexible circuit substrate 2a according to the present invention comprising a single-sided board. The flexible circuit substrate 2a comprises a base plate 24 and pre-etched conductive lines 241 formed on an upper surface of the base plate 24.

Figure 5:
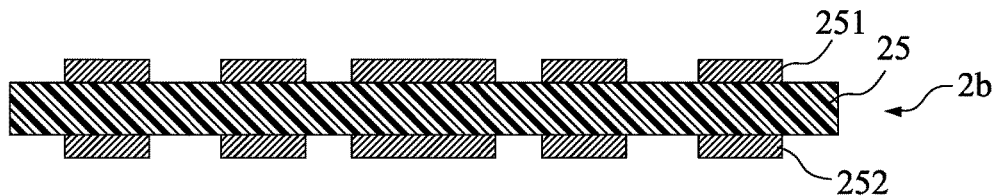
FIG. 5 is a schematic cross-sectional view showing a flexible circuit substrate according to the present invention comprising a double-sided board.

FIG. 5 is a schematic cross-sectional view showing a flexible circuit substrate 2b according to the present invention comprising a double-sided board. The flexible circuit substrate 2b comprises a base plate 25 and pre-etched conductive lines 251 formed on an upper surface of the base plate 25 and pre-etched conductive lines 252 formed on a lower surface.

Figure 6:
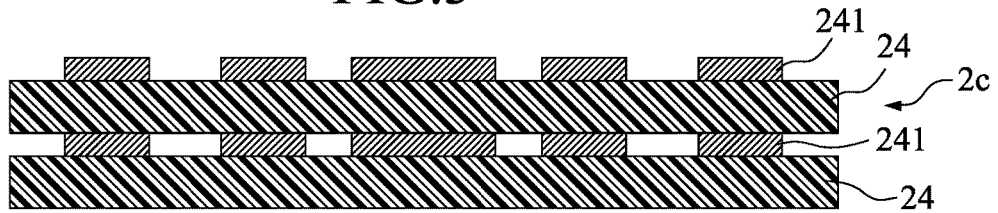
FIG. 6 is a schematic cross-sectional view showing a flexible circuit substrate according to the present invention comprising a multiple-layered board formed of two single-sided boards stacked vertically on each other.

FIG. 6 is a schematic cross-sectional view showing a flexible circuit substrate 2c according to the present invention comprising a multiple-layered board formed of two single-sided boards stacked vertically on each other. The two single-sided boards are each of a structure similar to that shown in FIG. 4.

Figure 7:
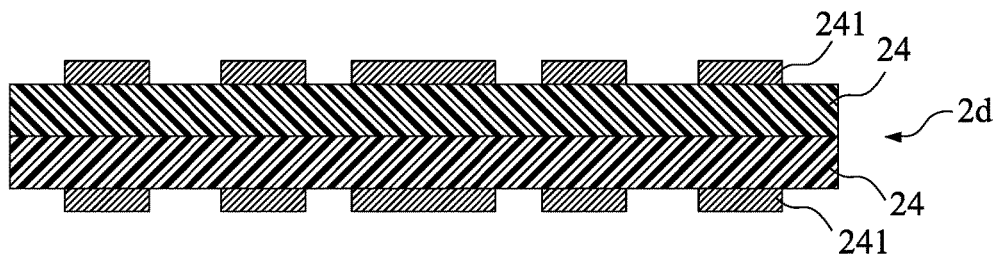
FIG. 7 is a schematic cross-sectional view showing a flexible circuit substrate according to the present invention comprising a multiple-layered board formed of two single-sided boards stacked on each other in a back-to-back manner.

FIG. 7 is a schematic cross-sectional view showing a flexible circuit substrate 2d according to the present invention comprising a multiple-layered board formed of two single-sided boards stacked on each other in a back-to-back manner. The two single-sided boards are each of a structure similar to that shown in FIG. 4.

Figure 8:
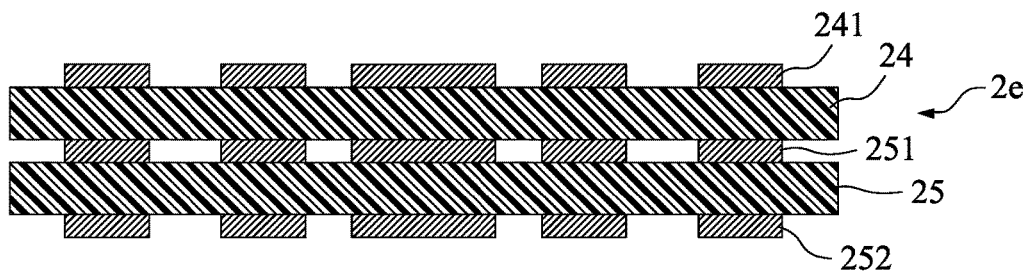
FIG. 8 is a schematic cross-sectional view showing a flexible circuit substrate according to the present invention comprising a multiple-layered board formed of a single-sided board and a double-sided board stacked on each other.

FIG. 8 is a schematic cross-sectional view showing a flexible circuit substrate 2e according to the present invention comprising a multiple-layered board formed of a single-sided board and a double-sided board stacked on each other, wherein the single-sided board is of a structure similar to that shown in FIG. 4 and the double-sided board is of a structure similar to that shown in FIG. 5.

Although the present invention has been described with reference to the preferred embodiments thereof, it is apparent to those skilled in the art that a variety of modifications and changes may be made without departing from the scope of the present invention which is intended to be defined by the appended claims.

What is claimed is:

1. A method for manufacturing a flexible circuit board, comprising the following steps:
    (a) providing a first carrier board comprising:
        a first thick copper layer;
        a first thin copper layer, which has a top surface and a bottom surface; and
        a first release layer, which is formed between the first thick copper layer and the top surface of the first thin copper layer;
    (b) providing a flexible circuit substrate, which has a first surface and a second surface, wherein the second surface of the flexible circuit substrate comprises a bottom copper layer formed thereon;
    (c) bonding the first surface of the flexible circuit substrate to the bottom surface of the first thin copper layer of the first carrier board with a first adhesive layer;
    (d) forming at least one through hole extending through the first thick copper layer, the first release layer, the first thin copper layer, the first adhesive layer, the flexible circuit substrate, and the bottom copper layer, the through hole having a hole wall surface; and
    (e) forming a first electroplating layer on a top surface of the first thick copper layer, the hole wall surface, and a bottom surface of the bottom copper layer.

2. The method for manufacturing the flexible circuit board as claimed in claim 1 further comprising, after step (e), the following steps:
    (f) peeling the first release layer together with the first thick copper layer from the top surface of the first thin copper layer with the first thin copper layer being preserved by being bonded by the first adhesive layer to the first surface of the flexible circuit substrate and the bottom copper layer being located on the second surface of the flexible circuit substrate;

(g) forming at least one photoresist layer at a predetermined location on the top surface of the first thin copper layer;
(h) forming an upper conductor layer on areas of the top surface of the first thin copper layer that are not covered by the photoresist layer and forming a lower conductor layer on a bottom surface of the first electroplating layer;
(i) removing the photoresist layer; and
(j) applying micro-etching to areas of the first thin copper layer that are not covered by the upper conductor layer.

3. The method for manufacturing the flexible circuit board as claimed in claim 2 further comprising, after step (j), the following steps:
(k) forming at least one lower photoresist layer at a predetermined location on a bottom surface of the lower conductor layer;
(l) applying etching to areas of the lower conductor layer, the first electroplating layer, and the bottom copper layer that are not covered by the lower photoresist layer; and
(m) removing the lower photoresist layer.

4. The method for manufacturing the flexible circuit board as claimed in claim 1, wherein the flexible circuit substrate comprises one of a single-sided board, a doubled-sided board, a multiple-layered board, and a rigid-flex board.

5. A method for manufacturing a flexible circuit board, comprising the following steps:
(a) providing a first carrier board comprising:
a first thick copper layer;
a first thin copper layer, which has a top surface and a bottom surface; and
a first release layer, which is formed between the first thick copper layer and the top surface of the first thin copper layer;
(b) providing a flexible circuit substrate, which has a first surface and a second surface;
(c) providing a second carrier board, which comprises:
a second thick copper layer;
a second thin copper layer, which has a bottom surface and a top surface; and
a second release layer, which is formed between second first thick copper layer and the bottom surface of the second thin copper layer;
(d) bonding the first surface of the flexible circuit substrate to the bottom surface of the first thin copper layer of the first carrier board with a first adhesive layer;
(e) bonding the second surface of the flexible circuit substrate to the top surface of the second thin copper layer of the second carrier board with a second adhesive layer;
(f) forming at least one through hole extending through the first thick copper layer, the first release layer, the first thin copper layer, the first adhesive layer, the flexible circuit substrate, the second adhesive layer, the second thin copper layer, the second release layer, and the second thick copper layer, the through hole comprising a hole wall surface; and
(g) forming a second electroplating layer on a top surface of the first thick copper layer, the hole wall surface, and a bottom surface of the second thick copper layer.

6. The method for manufacturing the structure of the flexible circuit board combined with the carrier board as claimed in claim 5 further comprising, after step (g), the following steps:
(h) peeling the first release layer together with the first thick copper layer from the top surface of the first thin copper layer with the first thin copper layer being preserved by being bonded by the first adhesive layer to the first surface of the flexible circuit substrate;
(i) peeling the second release layer together with the second thick copper layer from the bottom surface of the second thin copper layer with the second thin copper layer being preserved by being bonded by the second adhesive layer to the second surface of the flexible circuit substrate;
(j) forming at least one photoresist layer at a predetermined location on the top surface of the first thin copper layer and forming at least one lower photoresist layer at a predetermined location on the bottom surface of the second thin copper layer;
(k) forming an upper conductor layer on areas of the top surface of the first thin copper layer that are not covered by the photoresist layer and forming a lower conductor layer on areas of the bottom surface of the second thin copper layer that are not covered by the lower photoresist layer;
(l) removing the photoresist layer and the lower photoresist layer; and
(m) applying micro-etching to areas of the first thin copper layer that are not covered by the upper conductor layer and areas of the second thin copper layer that are not covered by the lower conductor layer.

7. The method for manufacturing the structure of the flexible circuit board combined with the carrier board as claimed in claim 5, wherein the flexible circuit substrate comprises one of a single-sided board, a doubled-sided board, a multiple-layered board, and a rigid-flex board.

8. A method for manufacturing a flexible circuit board, comprising the following steps:
(a) providing a first carrier board comprising:
a first thick copper layer;
a first thin copper layer, which has a top surface and a bottom surface; and
a first release layer, which is formed between the first thick copper layer and the top surface of the first thin copper layer;
(b) providing a flexible circuit substrate, which has a first surface and a second surface;
(c) providing a second carrier board, which comprises:
a second thick copper layer;
a second thin copper layer, which has a bottom surface and a top surface; and
a second release layer, which is formed between second first thick copper layer and the bottom surface of the second thin copper layer;
(d) bonding the first surface of the flexible circuit substrate to the bottom surface of the first thin copper layer of the first carrier board with a first adhesive layer;
(e) bonding the second surface of the flexible circuit substrate to the top surface of the second thin copper layer of the second carrier board with a second adhesive layer;
(f) forming at least one blind hole extending through the first thick copper layer, the first release layer, the first thin copper layer, the first adhesive layer, the flexible circuit substrate, and the second adhesive layer to expose a portion of the top surface of the second thin copper layer corresponding to the blind hole to form a thin copper contact zone on the second thin copper layer, the blind hole having a blind hole wall surface; and
(g) forming a third electroplating layer on a top surface of the first thick copper layer, the blind hole wall surface, the thin copper contact zone, and a bottom surface of the second thick copper layer.

9. The method for manufacturing the flexible circuit board as claimed in claim 8 further comprising, after step (g), the following steps:
- (h) peeling the first release layer together with the first thick copper layer from the top surface of the first thin copper layer with the first thin copper layer being preserved by being bonded by the first adhesive layer to the first surface of the flexible circuit substrate;
- (i) peeling the second release layer together with the second thick copper layer from the bottom surface of the second thin copper layer with the second thin copper layer being preserved by being bonded by the second adhesive layer to the second surface of the flexible circuit substrate;
- (j) forming at least one photoresist layer at a predetermined location on the top surface of the first thin copper layer and forming at least one lower photoresist layer at a predetermined location on the bottom surface of the second thin copper layer;
- (k) forming an upper conductor layer on areas of the top surface of the first thin copper layer that are not covered by the photoresist layer and forming a lower conductor layer on areas of the bottom surface of the second thin copper layer that are not covered by the lower photoresist layer;
- (l) removing the photoresist layer and the lower photoresist layer; and
- (m) applying micro-etching to areas of the first thin copper layer that are not covered by the upper conductor layer and areas of the second thin copper layer that are not covered by the lower conductor layer.

10. The method for manufacturing the flexible circuit board as claimed in claim 8, wherein the flexible circuit substrate comprises one of a single-sided board, a doubled-sided board, a multiple-layered board, and a rigid-flex board.

* * * * *